United States Patent
Fan et al.

(10) Patent No.: US 7,049,177 B1
(45) Date of Patent: May 23, 2006

(54) LEADLESS PLASTIC CHIP CARRIER WITH STANDOFF CONTACTS AND DIE ATTACH PAD

(75) Inventors: Chun Ho Fan, Sham Tseng (HK);
Wing Him Lau, Yuen Long (HK);
Kenneth Kwan, Hong Kong (HK);
Janet Wong, Tai Kok Tsui (HK)

(73) Assignee: ASAT Ltd., Tsuen Wan (HK)

( * ) Notice: Subject to any disclaimer, the term of this patent is extended or adjusted under 35 U.S.C. 154(b) by 130 days.

(21) Appl. No.: 10/765,192

(22) Filed: Jan. 28, 2004

(51) Int. Cl.
*H01L 21/50* (2006.01)
(52) U.S. Cl. ...................... 438/123; 257/676
(58) Field of Classification Search ............... 257/668, 257/676, 784, 786; 438/106, 111, 123–127, 438/611–617
See application file for complete search history.

(56) References Cited

U.S. PATENT DOCUMENTS

| | | | |
|---|---|---|---|
| 4,530,152 A | 7/1985 | Roche et al. | 29/588 |
| 5,457,340 A | 10/1995 | Templeton, Jr. et al. | 257/666 |
| 5,710,695 A | 1/1998 | Manteghi | 361/813 |
| 5,910,644 A * | 6/1999 | Goodman et al. | 174/260 |
| 5,976,912 A | 11/1999 | Fukutomi et al. | 438/110 |
| 6,001,671 A | 12/1999 | Fjelstad | 438/112 |
| 6,229,200 B1 | 5/2001 | Mclellan et al. | 257/666 |
| 6,400,004 B1 * | 6/2002 | Fan et al. | 257/690 |
| 6,545,347 B1 * | 4/2003 | McClellan | 257/666 |
| 6,812,552 B1 * | 11/2004 | Islam et al. | 257/692 |
| 2002/0197826 A1 * | 12/2002 | Kim et al. | 438/460 |

FOREIGN PATENT DOCUMENTS

JP  59-208756  11/1984

* cited by examiner

*Primary Examiner*—David Nelms
*Assistant Examiner*—Calvin Lee
(74) *Attorney, Agent, or Firm*—Mayer, Brown, Rowe & Maw LLP

(57) ABSTRACT

A process for fabricating a leadless plastic chip carrier includes selectively etching at least a first surface of a leadframe strip to partially define at least a plurality of contact pads and a die attach pad; selectively plating at least one layer of metal on a second surface of the leadframe strip, on an undersurface of at least the plurality of contact pads and the die attach pad; mounting a semiconductor die on the first surface, on the partially defined die attach pad; wire bonding the semiconductor die to ones of the contact pads; encapsulating the wire bonds and the semiconductor die in a molding material such that the molding material covers a first portion of the die attach pad and first portions of the contact pads; selectively etching a second surface of the leadframe strip to define a second portion of the contact pads and a second portion of the die attach pad by etching the second surface with the at least one layer of metal resisting etching; and singulating the leadless plastic chip carrier from the leadframe strip.

11 Claims, 4 Drawing Sheets

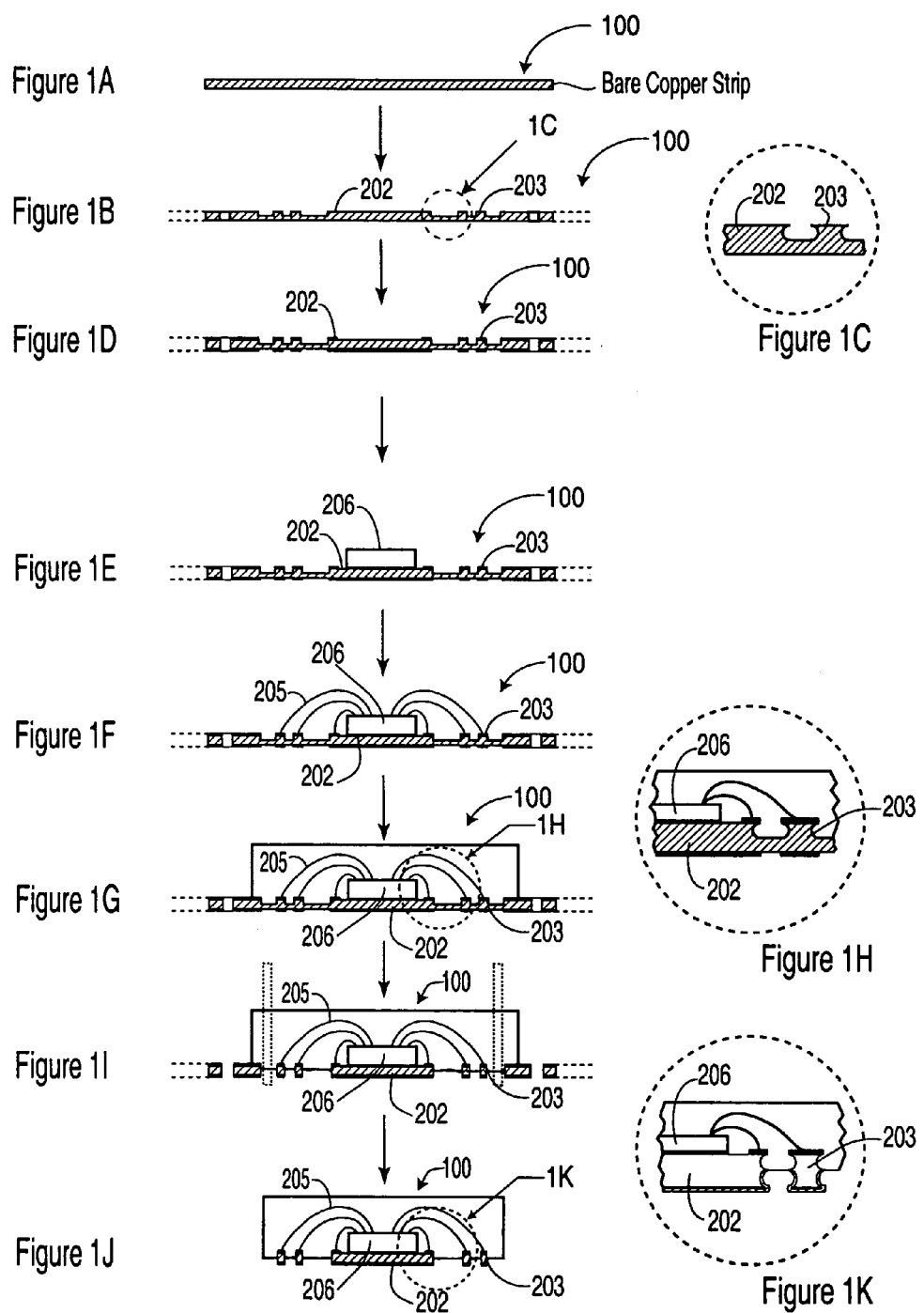

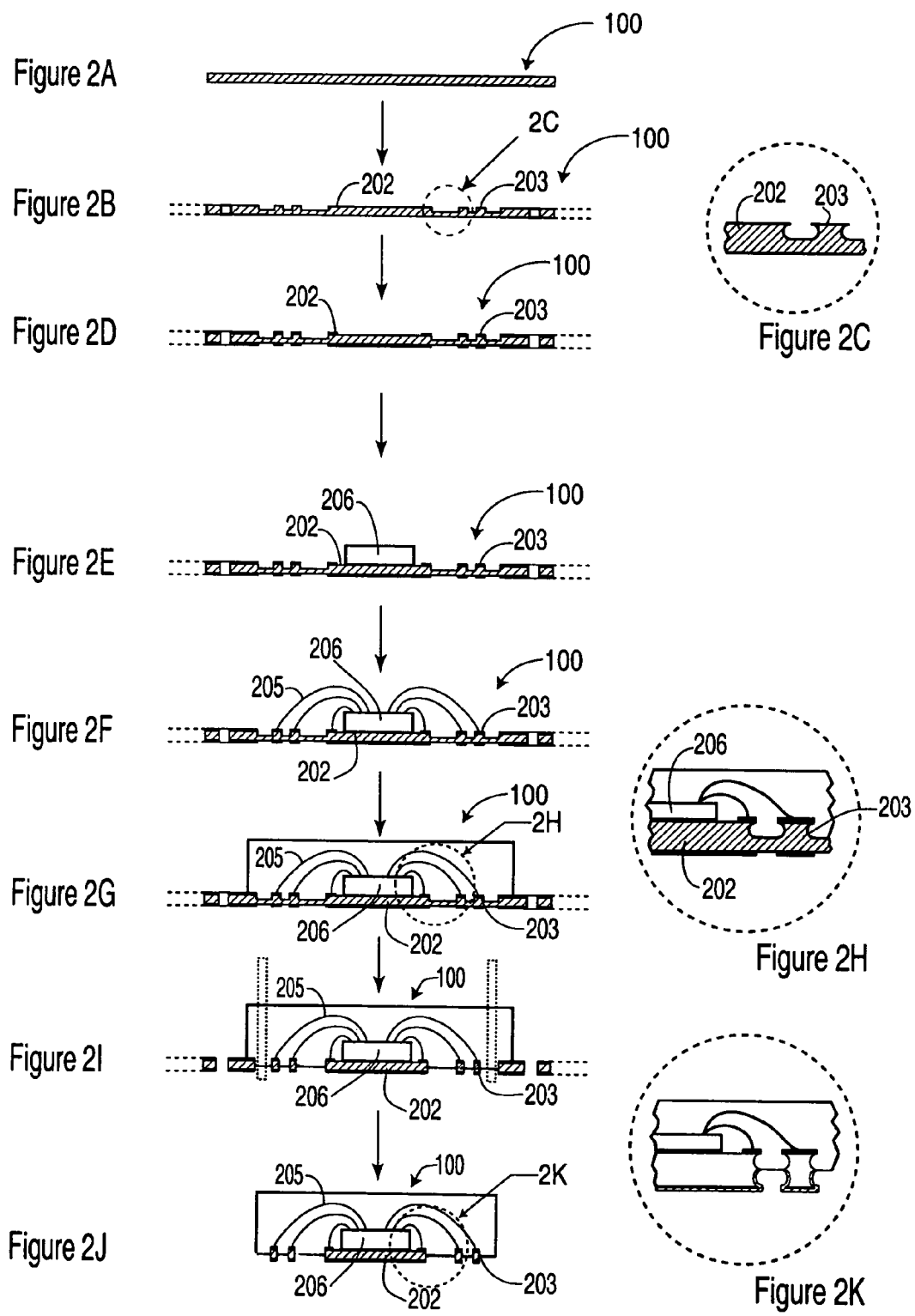

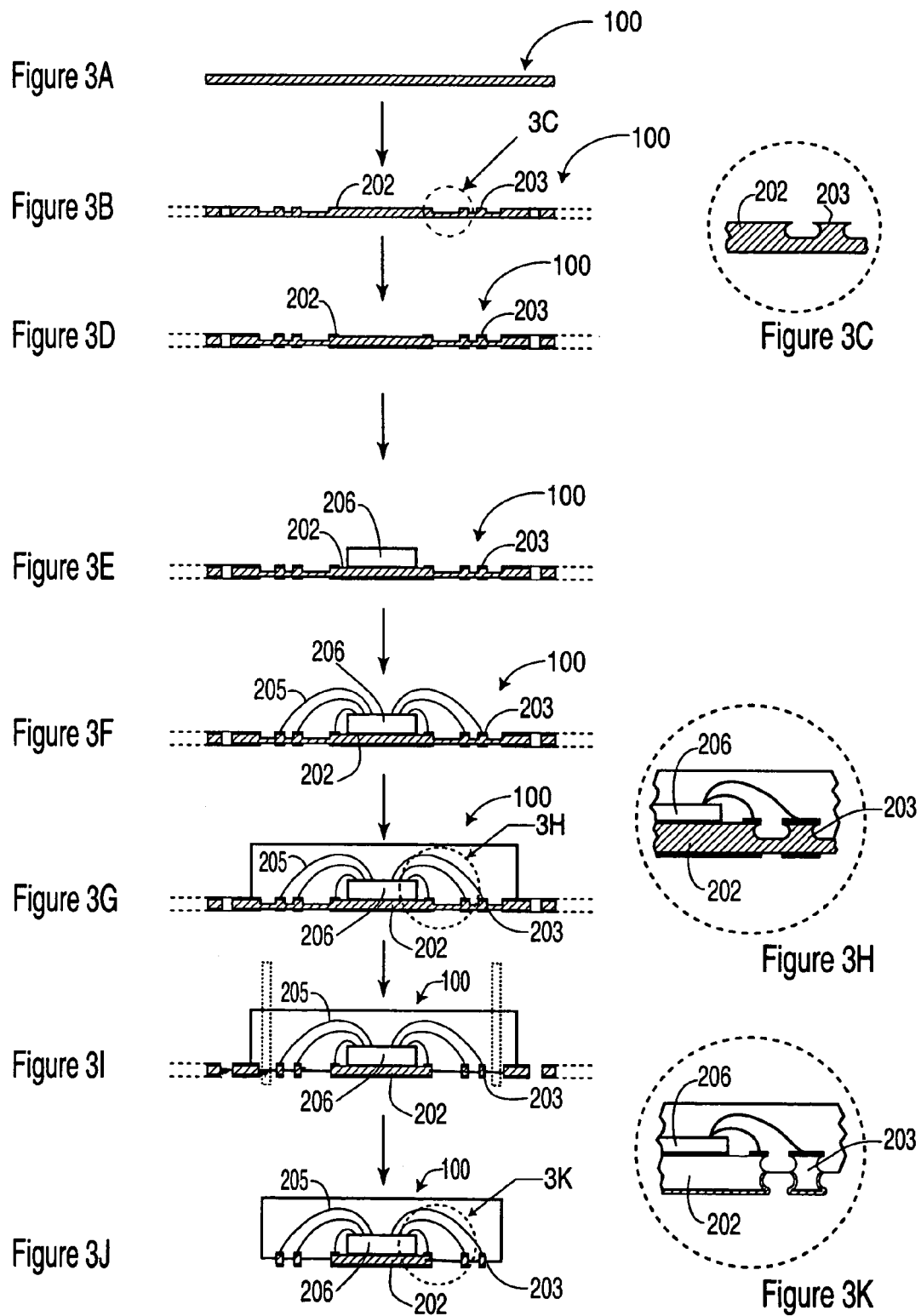

LEADLESS PLASTIC CHIP CARRIER WITH STANDOFF CONTACTS AND DIE ATTACH PAD

FIELD OF THE INVENTION

The present invention relates in general to integrated circuit packaging and more particularly to an improved leadless plastic chip carrier including standoff contacts.

BACKGROUND OF THE INVENTION

According to well known prior art IC (integrated circuit) packaging methodologies, semiconductor dice are singulated and mounted using epoxy or other conventional means onto respective die pads (attach paddles) of a leadframe strip. Traditional QFP (Quad Flat Pack) packages incorporate inner leads which function as lands for wire bonding the semiconductor die bond pads. These inner leads typically require mold locking features to ensure proper positioning of the leadframe strip during subsequent molding to encapsulate the package. The inner leads terminate in outer leads that are bent down to contact a mother board, thereby limiting the packaging density of such prior art devices.

In order to overcome these and other disadvantages of the prior art, the Applicants previously developed a Leadless Plastic Chip Carrier (LPCC). According to Applicants' LPCC methodology, a leadframe strip is provided for supporting up to several hundred devices. Singulated IC dice are placed on the strip die attach pads using conventional die mount and epoxy techniques. After curing of the epoxy, the dice are gold wire bonded to peripheral internal leads. The leadframe strip is then molded in plastic or resin using a modified mold wherein the bottom cavity is a flat plate. In the resulting molded package, the die pad and leadframe inner leads are exposed. By exposing the bottom of the die attach pad, mold delamination at the bottom of the die attach pad (paddle) is eliminated, thereby increasing the moisture sensitivity performance. Also, thermal performance of the IC package is improved by providing a direct thermal path from the exposed die attach pad to the motherboard. By exposing the leadframe inner leads, the requirement for mold locking features of outer leads is eliminated and no outer leads are necessary, thereby increasing device density and reducing package thickness over prior art methodologies. The exposed inner leadframe leads function as solder pads for motherboard assembly such that less gold wire bonding is required as compared to prior art methodologies, thereby improving electrical performance in terms of board level parasitics and enhancing package design flexibility over prior art packages (i.e. custom trim tools and form tools are not required). These and several other advantages of Applicants' own prior art LPCC process are discussed in Applicants' U.S. Pat. No. 6,229,200, issued May 8, 2001, the contents of which are incorporated herein by reference.

Applicants' LPCC production methodology utilizes saw singulation to isolate the perimeter I/O row as well as multi-row partial lead isolation. Specifically, the leadframe strip is mounted to a wafer saw ring using adhesive tape and saw-singulated using a conventional wafer saw. The singulation is guided by a pattern of fiducial marks on the bottom side of the leadframe strip. Also, special mold processing techniques are used to prevent the mold flow from bleeding onto the functional pad area and inhibiting electrical contact. Specifically, the exposed die pad surface is required to be deflashed after molding to remove any molding compound residue and thereby allow the exposed leads and die attach pad to serve as solder pads for attachment to the motherboard.

According to Applicants' U.S. Pat. No. 6,498,099, the contents of which are incorporated herein by reference, a localized etch process is provided for the improved manufacture of the LPCC IC package. The leadframe strip is subjected to a partial etch on one or both of the top and bottom surfaces in order to create a pattern of contact leads (pads) and a die attach pad (paddle). This method of manufacture provides many advantages. However, an etch-resistant layer is applied to the bottom surface of the leadframe, after molding and prior to post-mold etching to define the contact pads and the die attach pad. Thus, an etch-resist is added to the bottom surface of the leadframe strip during assembly. An additional fabrication step of adding the etch-resistant layer to the bottom surface of the leadframe strip is therefore used.

While these processes yield IC package designs with improved electrical performance, additional improvements are still desired.

SUMMARY OF THE INVENTION

According to an aspect of the present invention, there is provided a process for fabricating a leadless plastic chip carrier includes selectively etching at least a first surface of a leadframe strip to partially define at least a plurality of contact pads and a die attach pad; selectively plating at least one layer of metal on a second surface of the leadframe strip, on an undersurface of at least the plurality of contact pads and the die attach pad; mounting a semiconductor die on the first surface, on the partially defined die attach pad; wire bonding the semiconductor die to ones of the contact pads; encapsulating the wire bonds and the semiconductor die in a molding material such that the molding material covers a first portion of the die attach pad and first portions of the contact pads; selectively etching a second surface of the leadframe strip to define a second portion of the contact pads and a second portion of the die attach pad by etching the second surface with the at least one layer of metal resisting etching; and singulating the leadless plastic chip carrier from the leadframe strip.

In another aspect, there is provided a process for fabricating a leadless plastic chip carrier including selectively etching at least a first surface of a leadframe strip to partially define at least a plurality of contact pads and a die attach pad; selectively plating at least one layer of metal on said first surface of said leadframe strip and on a second surface of said leadframe strip, on an undersurface of at least said plurality of contact pads and said die attach pad; mounting a semiconductor die on said first surface, on the partially defined die attach pad; wire bonding said semiconductor die to ones of said contact pads; encapsulating said wire bonds and the semiconductor die in a molding material such that said molding material covers a first portion of said die attach pad and first portions of said contact pads; selectively etching a second surface of said leadframe strip to define a second portion of said contact pads and a second portion of said die attach pad by etching said second surface with said at least one layer of metal on said second surface resisting etching; and singulating said leadless plastic chip carrier from said leadframe strip.

Advantageously, the leadframe strip is prepared and pre-plated with etch-resist prior to assembly of the leadless plastic chip carrier (prior to mounting the semiconductor die to the die attach pad). Thus, the plating steps are carried out during manufacture of the leadframe strip rather than during assembly of the leadless plastic chip carrier.

The standoff contact pads and die attach pad of the present invention improve motherboard assembly, allowing for better solder assembly to the motherboard and reduced stresses at the solder joints to the motherboard. This is accomplished while maintaining improved package density, thermal performance and electrical performance over traditional QFP packages. Also, undercut etch portions of the copper leadframe provide mold-interlocking for a more robust package.

After post-mold etching of the molded strip the contact pads and the die attach pads of each of the units of the leadframe strip are electrically isolated. However, the mold holds the strip together in a single piece, thereby permitting electrical functional testing for each device while still in the strip.

BRIEF DESCRIPTION OF THE DRAWINGS

The invention will be better understood with reference to the drawings and the following description, in which:

FIGS. 1A–1K show processing steps for manufacturing a leadless plastic chip carrier (LPCC) with standoff contacts and die attach pad according to an embodiment of the present invention;

FIGS. 2A–2K show processing steps for manufacturing a LPCC with standoff contacts and die attach pad according to another embodiment of the present invention;

FIGS. 3A–3K show processing steps for manufacturing a LPCC with standoff contacts and die attach pad according to yet another embodiment of the present invention.

DETAILED DESCRIPTION OF THE PREFERRED EMBODIMENTS

Figure 4A:
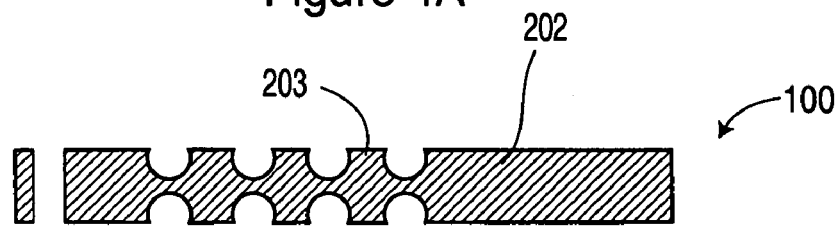
FIGS. 4A–4C show various stages of the process for manufacturing a LPCC with standoff contacts and die attach pad according to still another alternative embodiment of the present invention.

The present invention relates to an improvement over Applicant's U.S. Pat. No. 6,229,200 for a Saw Singulated Leadless Plastic Chip Carrier (LPCC). Where possible, the same reference numerals have been used in this application to denote identical features described in Applicant's above-noted LPCC patent.

Reference is first made to FIGS. 1A to 1H to describe the processing steps for manufacturing a LPCC with standoff contacts (contact pads) and die attach pad according to an embodiment of the present invention. FIG. 1A shows an elevation view of a Cu (copper) panel substrate which forms the raw material of the leadframe strip indicated generally by the numeral 100. As discussed in detail in Applicant's U.S. Pat. No. 6,299,200, the leadframe strip 100 is divided into a plurality of sections, each of which incorporates a plurality of leadframe units in an array (e.g. 3×3 array, 5×5 array, etc.). Only one such whole unit is depicted in the elevation view of FIG. 1A, portions of adjacent units being shown. It will be appreciated that adjacent units of the leadframe strip are similar to the unit depicted and are further indicated by stippled lines.

Referring to FIG. 1B, the top portion of the leadframe strip 100 is subjected to a partial etch (FIG. 1B) to partially pattern the contact pads 203 and the die attach pad 202. The partial etch is carried out by coating the top and bottom surfaces of the leadframe 100 with a layer of photo-imageable etch resist such as a photo-imageable epoxy. The etch resist is spin coated on the leadframe strip, selectively exposed on the top portion of the leadframe strip 100, with ultraviolet light using a photo-tool and the exposed portions are removed. The etch resist is thereby patterned to provide pits on the upper surface of the leadframe strip, in which the metal substrate is exposed. The leadframe strip 100 is then immersion or pressurized spray etched to partially pattern the contact pads 203 and the die attach pad 202 and the etch resist is stripped away using conventional means. The resulting leadframe strip 100 is shown in FIG. 1B.

FIG. 1C shows an enlarged portion of the leadframe strip 100. As shown, the etched-down portions of the leadframe strip 100 include curved undercuts on each side of each etched-down portions which act as a mold-interlocking feature for mold compound adherence.

The top side of the leadframe strip is then selectively plated with silver (Ag) or nickel and palladium (Ni/Pd) or nickel and gold (Ni/Au) (FIG. 1D). Similarly, the bottom side of the leadframe strip is selectively plated with Ag or Ni/Pd or Ni/Au. Thus, both the top and bottom sides of the leadframe strip are selectively plated. The plating covers a peripheral portion of the upper surface of the die attach pad 202 and the upper surface of the contact pads 203. It will be appreciated that the peripheral portion of the die attach pad is plated to form a ground ring for ground bond application. The plating facilitates ground-wire bonding to the ground ring and wire bonding to the contact pads 203. The plating also covers a bottom surface of the die attach pad 202 and the contact pads 203, to act as an etch-resist during post-molding etching, as described below. Thus, it will be appreciated that the leadframe strip including the bottom surface thereof, is prepared and pre-plated with etch-resist prior to assembly of the leadless plastic chip carrier (prior to mounting the semiconductor die to the die attach pad).

A singulated semiconductor die 206 is conventionally mounted via epoxy (or other means) to the die attach pad 202, and the epoxy is cured (FIG. 1E). Gold wires 205 are then bonded between the semiconductor die 206 and peripheral leads or contacts 203 and between the semiconductor die 206 and the ground ring (FIG. 1F). The leadframe 100 is then molded using a modified mold with the bottom cavity being a flat plate, and subsequently cured (FIG. 1G). FIG. 1H shows a cross-sectional side view of an enlarged portion of the leadframe strip 100 after molding.

It will be appreciated that the contacts 203 and the die attach pad 202 are still connected by bridges of copper leadframe strip 100. In order to remove the copper between the contacts 203 and the die attach pad 202, the leadframe strip 100 is subjected to a post-mold etch. The plating on the bottom surface of the leadframe strip 100 acts as an etch-resist and the bridges of copper between the contacts 203 and the die attach pad 202 are etched away (FIG. 1I) thereby defining the bottom portion of the die attach pad 202 and the contacts 203.

Singulation of the individual units from the full leadframe array strip 100 is then performed either by saw singulation or die punching. In the present embodiment, the individual unit is singulated by saw singulation, the cutting path of the cutting wheel saw being indicated in ghost outline in FIG. 1I. Clearly, a portion of the selectively etched leadframe strip 100 that does not become part of the IC package is saw singulated away. This portion, referred to as the perimeter of the pad frame, is plated during selective plating shown in FIG. 1D. Part of the perimeter of the pad frame is covered by mold compound in FIG. 1G, and is saw singulated away at FIG. 1I. This plating provides rigidity and helps provide a more robust manufacturing process.

Finally, the die attach pad 202 and the contacts 203 are coated to protect the exposed die attach pad 202 and the contacts 203 from oxidation (FIGS. 1J and 1K). In the present embodiment, the singulated unit is immersed in tin and tin is thereby deposited on the exposed die attach pad 202 and the contacts 203 in an electroless plating process. The tin coating also serves to improve solderability at the die attach pad 202 and contacts 203. FIG. 1K shows a cross-sectional side view of an enlarged portion of the resulting IC package, according to the first embodiment of the present invention. As shown, the die attach pad 202 and contact pads 203 stand off (protrude) from a remainder of the IC package, and particularly from the molding compound, thereby providing an IC package with standoff die attach pad 202 and contacts 203.

Referring now to FIGS. 2A–2K, there is provided processing steps for manufacturing a LPCC with standoff contacts and die attach pad according to another embodiment of the present invention. The manufacturing steps depicted in FIGS. 2A–2I are substantially identical to the manufacturing steps described above with reference to FIGS. 1A–1I and therefore need not be further described herein.

In the present embodiment, rather than being coated by electroless plating tin, the die attach pad 202 and contacts 203 are coated by fluxing and dipping the singulated unit into a molten solder alloy (FIGS. 2J and 2K). The resulting solder coating protects the exposed die attach pad 202 and contacts 203 from oxidation and improves solderability.

Referring now to FIGS. 3A–3K, there is provided processing steps for manufacturing a LPCC with standoff contacts and die attach pad according to yet another embodiment of the present invention. The manufacturing steps depicted in FIGS. 3A–3I are substantially identical to the manufacturing steps described above with reference to FIGS. 1A–1I and therefore need not be further described herein.

In the present embodiment, rather than being coated by electroless plated tin, the selectively plated metal on the bottom of the metal leadframe strip is stripped away using known stripping techniques. After stripping, the die attach pad 202 and contacts 203 are coated by dipping in an organic surface protection (OSP) such as, for example, Entek which dries on the die attach pad 202 and contacts 203 (FIGS. 3J and 3K). The OSP is applied to protect the exposed portions of the metal leadframe strip from oxidizing as non-oxidized copper is advantageous for better solder wetting during surface mounting to the motherboard.

Figure 4B:
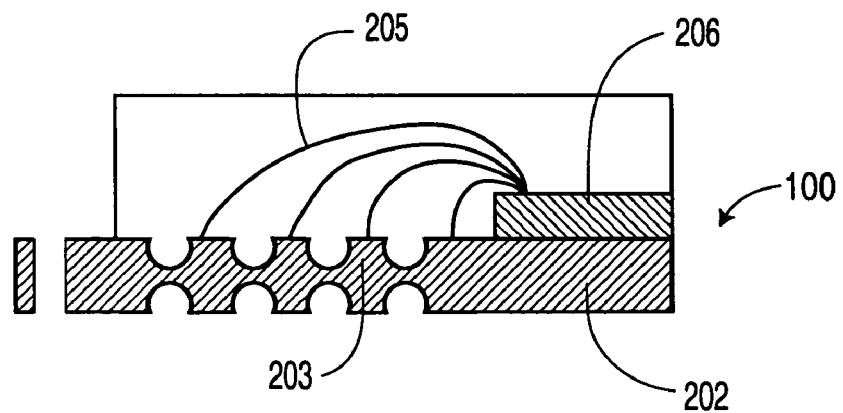
Figure 4C:
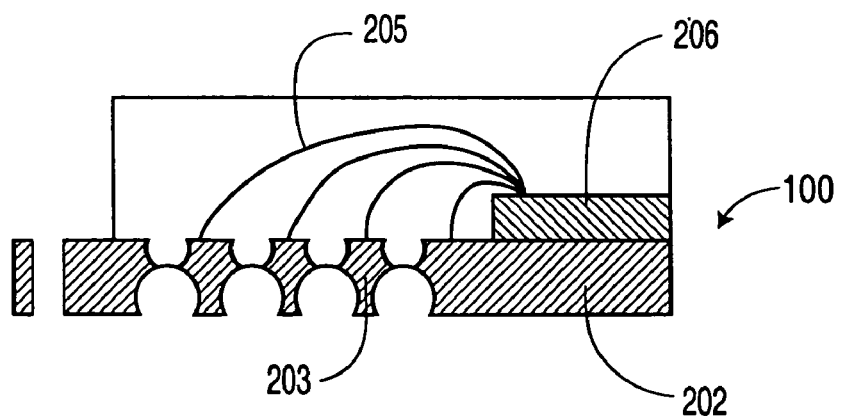

Specific embodiments of the present invention have been shown and described herein. However, modifications and variations to these embodiments are possible. For example, the leadframe strip in the above-described embodiment is a copper leadframe strip. However, other strip materials are possible, such as, iron-based alloys. Also, the photo resist can be applied by lamination rather than spin coating. Rather than selectively exposing only the top portion of the leadframe strip after applying the photo resist, the top and bottom of the leadframe strip can be selectively exposed to partially define at least the die attach pad and the contacts. FIGS. 4A–4C show various stages of the process for manufacturing a LPCC with standoff contacts and die attach pad, in which the top and bottom of the leadframe strip are selectively exposed to partially define die attach pad and the contacts. FIG. 4A shows a portion of the leadframe strip 100 after partially etching both the top and bottom to partially pattern the contact pads 203 and the die attach pad 202. The partial etch is carried out by coating the top and bottom surfaces of the leadframe 100 with a layer of photo-imageable etch resist such as a photo-imageable epoxy. The photo resist is spin coated on the leadframe strip, selectively exposed on both the top and bottom of the leadframe strip 100, with ultraviolet light using a photo-tool and the exposed portions are removed. The etch resist is thereby patterned to provide pits on both the upper and lower surfaces of the leadframe strip, in which the metal substrate is exposed. The leadframe strip 100 is then immersion or pressurized spray etched to partially pattern the contact pads 203 and the die attach pad 202 and the etch resist is stripped away using conventional means. A portion of the resulting leadframe strip 100 is shown in FIG. 4A. FIG. 4B shows a portion of the leadframe strip 100 of FIG. 4A after molding in the modified mold. FIG. 4C shows a portion of the leadframe strip 100 of FIG. 4A after post-mold etching to isolate the contact pads 203 and the die attach pad 202.

Other modifications and variations may occur to those skilled in the art. For example, rather than coating the exposed portions of the die attach pad 202 and the contacts 203 with tin as shown in FIGS. 1J and 1K, the die attach pad 202 and contacts 203 can be left uncoated. Also, rather than dipping the singulated unit into molten solder as described in the embodiments shown in FIGS. 2A to 2K, the solder coating can be aplied by waver solder technique. Still other modifications and variations may occur to those skilled in the art. All such modifications and variations are believed to be within the sphere and scope of the present invention.

We claim:

1. A process for fabricating a leadless plastic chip carrier, comprising:
    selectively etching at least a first surface of a leadframe strip to partially define at least a plurality of contact pads and a die attach pad;
    selectively plating at least one layer of metal on a second surface of said leadframe strip, on an undersurface of at least said plurality of contact pads and said die attach pad;
    selectively plating at least one layer of metal on said first surface of said leadframe strip including selectively plating said at least one layer of metal on only a peripheral portion of said die attach pad and plating said at least one layer of metal on a surface of said plurality of contact pads for facilitating wire bonding;
    mounting a semiconductor die on said first surface, on the partially defined die attach pad;
    wire bonding said semiconductor die to ones of said plurality of contact pads;
    encapsulating said wire bonds and the semiconductor die in a molding material such that said molding material covers a first portion of said die attach pad and first portions of said plurality of contact pads;
    selectively etching a second surface of said leadframe strip to define a second portion of said plurality of contact pads and a second portion of said die attach pad by etching said second surface with said at least one layer of metal resisting etching; and
    singulating said leadless plastic chip carrier from said leadframe strip.

2. The process for fabricating a leadless plastic chip carrier according to claim 1, wherein said selectively plating said at least one layer of metal on said first surface and said selectively plating said at least one layer of metal on said second surface is carried out in a single plating step.

3. The process for fabricating a leadless plastic chip carrier according to claim 1, further comprising coating all exposed surfaces of said second portion of said die attach pad and said second portion of said plurality of contact pads for oxidation protection.

4. The process for fabricating a leadless plastic chip carrier according to claim 3 wherein coating comprises dipping at least a portion of said leadless plastic chip carrier in at least one of tin, solder dipping, and organic surface protection.

5. The process for fabricating a leadless plastic chip carrier according to claim 1 wherein said at least one layer of metal is selected from the group consisting of a layer of silver, layers of nickel and gold, and layers of nickel and palladium.

6. The process for fabricating a leadless plastic chip carrier according to claim 1, wherein said step of selectively plating further includes selectively plating a perimeter portion of said leadframe strip for providing package rigidity, said perimeter portion being removed by said singulating.

7. A process for fabricating a leadless plastic chip carrier, comprising:

selectively etching a first surface and a second surface of a leadframe strip to define at least a plurality of contact pads and a die attach pad joined together by remaining portions of metal between etched away portions;

selectively plating at least one layer of metal on said first surface of said leadframe strip and on a second surface of said leadframe strip, on an undersurface of at least said plurality of contact pads and said die attach pad;

mounting a semiconductor die on said first surface, on the die attach pad;

wire bonding said semiconductor die to ones of said plurality of contact pads;

encapsulating said wire bonds and the semiconductor die in a molding material such that said molding material covers a first portion of said die attach pad and first portions of said plurality of contact pads;

further selectively etching to remove said remaining portions of metal between said etched away portions to isolate said plurality of contact pads and said die attach pad; and singulating said leadless plastic chip carrier from said leadframe strip.

8. The process for fabricating a leadless plastic chip carrier according to claim 7, further comprising coating a second portion of said die attach pad and a second portion of said plurality of contact pads for oxidation protection.

9. The process for fabricating a leadless plastic chip carrier according to claim 8, wherein coating comprises dipping at least a portion of said leadless plastic chip carrier in an organic surface protection material.

10. The process for fabricating a leadless plastic chip carrier according to claim 7 wherein said at least one layer of metal is selected from the group consisting of a layer of silver, layers of nickel and gold, and layers of nickel and palladium.

11. The process for fabricating a leadless plastic chip carrier according to claim 7, wherein said step of selectively plating further includes selectively plating a perimeter portion of said leadframe strip for providing package rigidity, said perimeter portion being removed by said singulating.

* * * * *